United States Patent
Ishikawa et al.

(10) Patent No.: US 7,471,162 B2
(45) Date of Patent: Dec. 30, 2008

(54) SURFACE MOUNT TYPE TEMPERATURE-COMPENSATED CRYSTAL OSCILLATOR

(75) Inventors: Takaaki Ishikawa, Saitama (JP); Kuichi Kubo, Sayama (JP); Fumio Asamura, Sayama (JP); Kozo Ono, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 113 days.

(21) Appl. No.: 11/787,403

(22) Filed: Apr. 16, 2007

(65) Prior Publication Data

US 2007/0247249 A1 Oct. 25, 2007

(30) Foreign Application Priority Data

Apr. 24, 2006 (JP) ............................. 2006-118960
Apr. 25, 2006 (JP) ............................. 2006/121283
May 31, 2006 (JP) ............................. 2006-151801

(51) Int. Cl.
*H03B 1/00* (2006.01)

(52) U.S. Cl. ........................... 331/68; 331/69; 331/158; 331/108 D

(58) Field of Classification Search ............ 331/68–69, 331/108 C–108 D, 158; 310/348
See application file for complete search history.

(56) References Cited

U.S. PATENT DOCUMENTS 6,798,307 B2 * 9/2004 Mizumura et al. .......... 331/158

2004/0056566 A1 * 3/2004 Rubach ....................... 310/348

FOREIGN PATENT DOCUMENTS

JP 2003-101348 4/2003

* cited by examiner

*Primary Examiner*—Anh Q Tran
(74) *Attorney, Agent, or Firm*—Scott D. Wofsy; Edwards Angell Palmer & Dodge LLP

(57) ABSTRACT

A temperature-compensated crystal oscillator for surface mounting wherein an IC chip into which is integrated a temperature-compensated device having an oscillating circuit and a temperature sensor, which supplies a compensation voltage to a variable-voltage capacitor element of the oscillating circuit, and which also has IC terminals disposed along two edges comprising at least diagonally opposite corner portions of one main surface that acts as a circuit function surface is affixed with the use of bumps to an inner base surface of a main container that is concave in section, and one edge portion of a crystal piece is affixed to an inner wall step portion of the main container; wherein an active element of the oscillating circuit that acts as a heat source and a temperature sensor of the temperature-compensated device are disposed at diagonally opposite corner regions of the IC chip at the greatest distance apart. In addition, IC terminals for thermal dissipation are provided in a central region of the IC chip. The present invention provides a temperature-compensated oscillator for surface mounting in which the temperature-compensation operation at startup is satisfactory and frequency stability is maintained.

15 Claims, 6 Drawing Sheets

SURFACE MOUNT TYPE TEMPERATURE-COMPENSATED CRYSTAL OSCILLATOR

BACKGROUND OF THE INVENTION

1. Field of the Invention

The present invention relates to a temperature-compensated crystal oscillator for surface mounting (hereinafter called a "temperature-compensated oscillator") and, in particular, to a surface-mount type oscillator that provides temperature compensation reliably at the startup thereof.

Since temperature-compensated oscillators for surface mounting are compact, lightweight, and have a high degree of frequency stability with respect to temperature changes, they are used as built-in frequency sources in portable devices such as mobile phones, particularly in changing temperature environments. One type is a temperature-compensated oscillator in which a temperature-compensating device and an oscillating circuit are integrated into an IC chip which is hermetically sealed in together with a crystal piece.

2. Description of Related Art

A temperature-compensated oscillator of the prior art is shown illustratively in FIG. 6, where FIG. 6A is a section through the temperature-compensated oscillator for surface mounting, FIG. 6B is a schematic diagram of circuit blocks used therein, FIG. 6C is an enlarged plan view as seen from below of an IC chip used therein, and FIG. 6D is a plan view of a crystal piece used therein.

This temperature-compensated oscillator has a configuration such that an IC chip 102 and a crystal piece 103 are housed in a main container 101 that is concave in section, having an inner wall step portion, and are covered by a metal cover 104. The main container 101 is formed of stacked ceramic layers 101a, 101b, and 101c, has mounting terminals 105 on the outer sides of the base surface thereof, and also writing terminals (not shown in the figure) for writing temperature compensation data on an outer side surface thereof. Circuit terminals (not shown in the figure) are provided on an inner base surface 101d of the main container 101 and also crystal-holding terminals (not shown in the figure) are provided on an inner wall step portion thereof.

The IC chip 102 has IC terminals 115 on one main surface thereof that is a circuit function surface, and is configured to have an oscillating circuit 106 and a temperature-compensating device 107 therein, excluding a crystal oscillator (the crystal piece 103). The IC terminals 115 include at least a pair of crystal terminals, and power source, output, and ground terminal, and also writing terminals or the like for writing temperature compensation data. The IC terminals 115 are formed on the sides of two edges that include at least diagonally opposite corner portions of one main surface of the IC chip 102, which is the circuit function surface thereof (see FIG. 6C).

The one main surface of the IC chip 102 is then placed face-down on the inner base surface 101d of the main container 101, and the IC terminals 115 are connected to the circuit terminals on the inner base surface 101d of the main container 101 by means such as ultrasonic thermal crimping using bumps 108 made of gold. Solder is applied to at least the surfaces of the bumps 108 and the affixing is done by reflow. The IC terminals 115 are connected to the corresponding mounting terminals 105, crystal-holding terminals, and writing terminals of the main container 101.

In this case, resin (as "underfill") that protects the circuit function surface is not applied between the one main surface of the IC chip 102 and the inner base surface 101d of the main container 101. This is because the IC chip 102 will be sealed into the main container 101 together with the crystal piece 103, and thus will be shielded and protected from the exterior, so there is no need for underfill.

The oscillating circuit 106 shown in FIG. 6B is formed from an inverter amplification element that is a CMOS element and a feedback circuit (not shown in the figure), by way of example. The resonance circuit is formed of the crystal oscillator (the crystal piece 103) and a dividing capacitor that is incorporated into the IC chip 102. The temperature-compensating device 107 has a temperature sensor is formed of a resistor or the like that detects the ambient temperature, to generate a compensation voltage Vc in response to that ambient temperature. The compensation voltage Vc is generated in accordance with temperature compensation data from the writing terminals, based on previously measured temperature characteristics.

As shown in FIG. 6D, the crystal piece 103 has a pair of symmetrical excitation electrodes 109 on the two main surfaces thereof, each with an output electrode 110 extending to either side of one end portion thereof. The two sides of the one edge portion to which the output electrodes 110 extend are affixed by an electrically conductive adhesive 11 to the crystal-holding terminals on the inner wall step portion of the main container 101, as shown in FIG. 6A. These crystal-holding terminals are connected to the crystal terminals of the IC chip 102 and form a resonance circuit together with a dividing capacitor. The metal cover 104 is affixed by means such as seam welding to a metal ring 112 provided on the aperture edge surface of the main container 101.

In the thus-configured prior-art temperature-compensated oscillator, the compensation voltage Vc that is based on changes in the resistance detected by the temperature sensor of the temperature-compensating device 107 (i.e., the ambient temperature) is applied to a variable-voltage capacitor element 113 that has been inserted within the oscillating circuit 106 (oscillation loop). Since the load capacitance varies as seen from the crystal oscillator, the frequency-temperature characteristic which is particularly dependent on the crystal oscillator (the crystal piece 103) and which forms a curve such as a cubic curve is flattened, and the frequency stability with respect to temperature can be increased. (See Japanese Patent Laid-Open Publication No. 2003-101348 (such as FIG. 1))

PROBLEMS WITH THE PRIOR-ART TECHNOLOGY

However, there is a problem with a temperature-compensated oscillator of the above-described configuration, in that the degree of stability is lost at start-up and thus the oscillator cannot satisfy predetermined standards sufficiently. In other words, at the start up of a temperature-compensated oscillator, the temperature of the IC chip 102 itself is higher than ambient temperature because of heat generated by active elements, particularly the oscillation amplifier and buffer amplifier, due to circuit currents generated within the oscillation amplifier.

In contrast thereto, crystal oscillator (the crystal piece 103) operates at the resonance frequency thereof in response to the ambient temperature. Thus the temperature sensor within the temperature-compensating device 107 that is integrated into the IC chip 102 detects a temperature that is higher than the operating temperature of the crystal oscillator (the crystal piece 103), and applies a compensation voltage Vc based on that temperature to the variable-voltage capacitor element 113. For example, even though the crystal oscillator is operating at a temperature 25° C. that reaches the nominal temperature fo, the temperature sensor detects a temperature that is higher than that, such as 27° C.

The temperature-compensating device 107 will then apply a compensation voltage Vc based on the detected temperature of 27° C. to the variable-voltage capacitor element 113. Since the oscillation frequency f varies from the nominal frequency fo, the frequency stability will worsen at startup. However, once some time has elapsed after startup and the temperatures of the IC chip 102 and the crystal piece 103 have come closer and become the same, the temperature-compensation operation will function normally so that the frequency stability can keep within standards.

Particularly in mobile phones in such a case, the temperature-compensated oscillator is activated in response to a clock frequency, and on/off operations are repeated. Erroneous temperature-compensation operation caused by the temperature difference between the IC chip 102 and the crystal oscillator 103 at startup can therefore be a big problem. Note that such a temperature-compensated oscillator often operates intermittently in response to the clock general register frequency, in order to save energy due to the power source voltage.

An objective of the present invention is to provide a temperature-compensated oscillator for surface mounting which has a favorable temperature-compensation operation at startup and which maintains frequency stability.

The present invention is based on the observation that there is a temperature distribution on the IC chip, in other words, heat is dissipated through the bumps and circuit terminals on the two edges on which the IC terminals 115 are positioned, as shown in FIG. 6C, so that the temperature is lower than at the central region. In this case, there is a large thermal dissipation effect from the IC terminals connected to the mounting terminals, particularly the power source, ground, and output terminals.

BRIEF SUMMARY OF THE INVENTION

The present invention relates to a temperature-compensated crystal oscillator for surface mounting wherein an IC chip into which is integrated a temperature-compensated device having an oscillating circuit and a temperature sensor, which supplies a compensation voltage to a variable-voltage capacitor element of the oscillating circuit, and which also has IC terminals disposed along two edges comprising at least diagonally opposite corner portions of one main surface that acts as a circuit function surface is affixed by ultrasonic thermal crimping using bumps to an inner base surface of a main container that is concave in section, and two sides of one edge portion of a crystal piece are affixed to an inner wall step portion of the main container; wherein an active element of the oscillating circuit that acts as a heat source and a temperature sensor of the temperature-compensated device are integrated and disposed at diagonally opposite corner regions of the IC chip at some distance apart.

The present invention also provides a temperature-compensated crystal oscillator for surface mounting wherein an IC chip into which is integrated a temperature-compensated device having an oscillating circuit and a temperature sensor, which supplies a compensation voltage to a variable-voltage capacitor element of the oscillating circuit, and which also has IC terminals disposed along two edges comprising at least diagonally opposite corner portions of one main surface that acts as a circuit function surface is affixed by ultrasonic thermal crimping using bumps to an inner base surface of a main container that is concave in section, and one edge portion of a crystal piece is affixed to an inner wall step portion of the main container; wherein an IC terminal for thermal dissipation is affixed by ultrasonic thermal crimping using bumps to a central region of the IC chip.

EFFECTS OF THE INVENTION

The present invention ensures that the active element and the temperature sensor are disposed internally at a distance at diagonally opposite corner regions of the IC chip at which the IC terminals are positioned. In this case, as shown by the above-described observation, the IC terminals are positioned at diagonally opposite corner portions of the IC chip and the temperature drops. In other words, heat generated at one diagonally opposite corner portion at which the active element that acts as a heat source is disposed dissipates thermally through the IC terminals, bumps, and circuit terminals in that one diagonally opposite corner portion.

Since the other diagonally opposite corner region at which the temperature sensor is disposed is at the greatest distance from the heat source in the first diagonally opposite corner region, and also heat is dissipated out through the IC terminals, bumps, and circuit terminals, any temperature rise due to the heat source has little effect thereon and thus any temperature rise due to thermal dissipation is suppressed. The temperature detected by the temperature sensor is therefore little affected by the effects of a temperature rise due to the heat source, so that the operating temperature of the crystal oscillator is close to the ambient temperature.

This configuration ensures that the temperature sensor can detect a temperature that is close to the operating temperature of the crystal oscillator (ambient temperature), even if there is a temperature rise due to the heat source at the startup of the temperature-compensated oscillator, and can supply a compensation voltage corresponding to that operating temperature to the variable-voltage capacitor element. The frequency stability can therefore be increased at the startup of the temperature-compensated oscillator.

Since present invention also provides IC terminals for thermal dissipation that are affixed by ultrasonic thermal crimping using bumps to a central region of the IC chip, the thermal dissipation effect can be further increased together with the IC terminals provided along the two sides of the IC chip. Similarly, it is thus possible to suppress any temperature rise due to the heat source and obtain an detected temperature that is close to the operating temperature (ambient temperature) of the crystal oscillator, together with the corresponding compensation voltage. This increases the frequency stability of the temperature-compensated oscillator at startup.

In addition, the present invention ensures that the IC terminals that are provided at diagonally opposite corner portions of the IC chip are connected electrically to the mounting terminals provided on the outer base surface of the main container. Since this means that the mounting terminals such as the power source, ground, and output terminals are connected to the circuit pattern on the set substrate, the thermal dissipation effect is increased.

Furthermore, since the present invention ensures that the active element of the oscillating circuit that acts as a heat source and the temperature sensor of the temperature-compensated device are integrated into and disposed at diagonally opposite corner regions of the IC chip, there is synergy with the above-described effect so that the temperature detected by the temperature sensor comes even closer to the operating temperature of the crystal oscillator.

The present invention also ensures that a thermally conductive adhesive made of a thermally conductive material mixed into a base adhesive substance is applied to the outer periphery of the side surfaces of the IC chip. This thermally conductive adhesive enables even more thermal dissipation of the heat generated by the heat source. The temperature detected by the temperature sensor therefore comes even closer to the operating temperature of the crystal oscillator, enabling a further increase in frequency stability at startup.

The present invention also provides a two-stage configuration of the inner step wall portion of the main container, to give an upper stage and a lower stage, the outer peripheral portion of the crystal piece is affixed to the upper stage, and also the lower stage and the other main surface of the IC chip are linked together through a metal plate that is affixed thereto by a thermally conductive material. This enables the transfer of heat from the IC chip that is generated by circuit currents therein, particularly at startup, to the main container by the metal plate affixed by the thermally conductive material, and thus thermal dissipation to the exterior.

BRIEF DESCRIPTION OF THE DRAWINGS

FIG. 1 shows a first embodiment of the present invention, where

FIG. 3 shows a second embodiment of the temperature-compensated oscillator of the present invention, where

FIG. 5 shows a third embodiment of the present invention, where FIG. 6 is illustrative of a temperature-compensated oscillator of the prior art, where

DETAILED DESCRIPTIONS OF THE INVENTION

FIRST EMBODIMENT

Figure 1A:
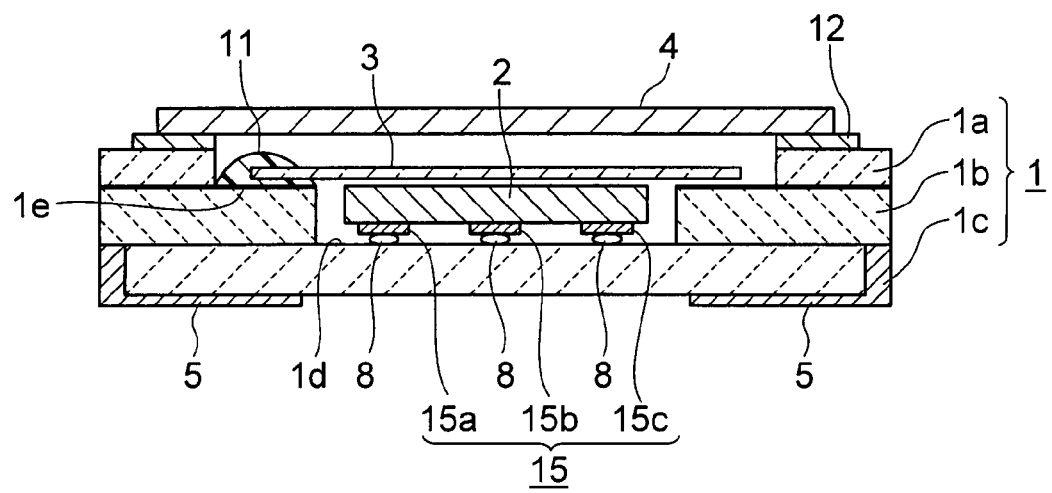
FIG. 1A is a sectional view of the temperature-compensated oscillator of this embodiment and FIG. 1B is an enlarged plan view thereof as seen from below the IC chip used therein.
Figure 1B:
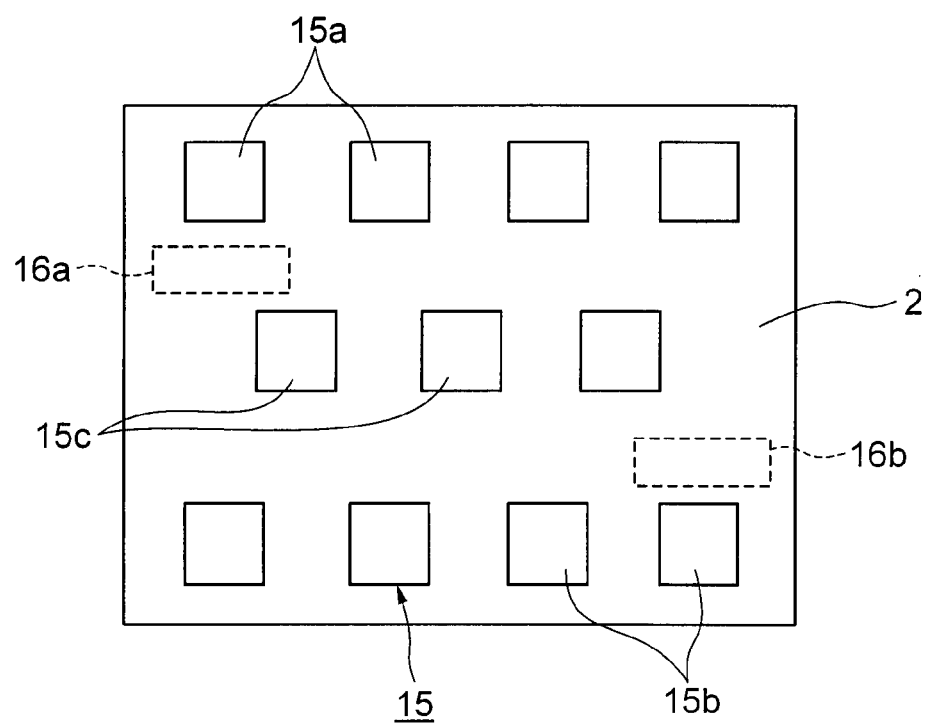

FIG. 1A shows a first embodiment of a temperature-compensated oscillator for surface mounting in accordance with the present invention, where FIG. 1A is a sectional view thereof and FIG. 1B is an enlarged plan view thereof as seen from below the IC chip used therein.

Figure 2:
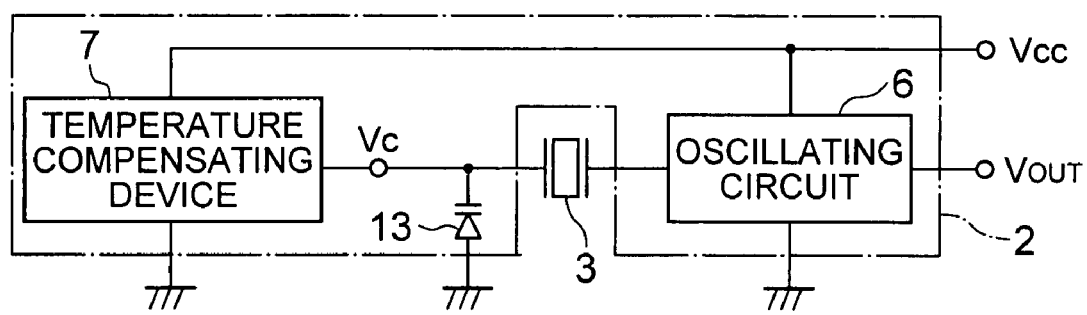
FIG. 2 is a schematic view of circuit blocks used in the temperature-compensated oscillator of the present invention.
Figure 6A:
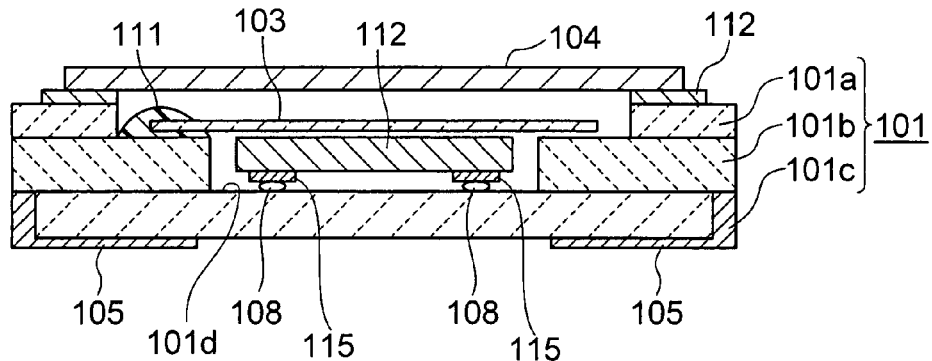
FIG. 6A is a section through the temperature-compensated oscillator for surface mounting.
Figure 6B:
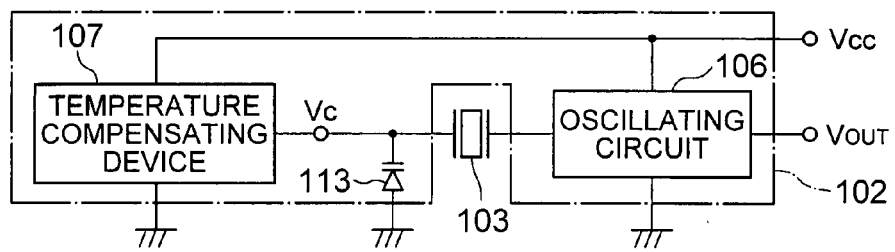
FIG. 6B is a schematic diagram of circuit blocks used therein.
Figure 6C:
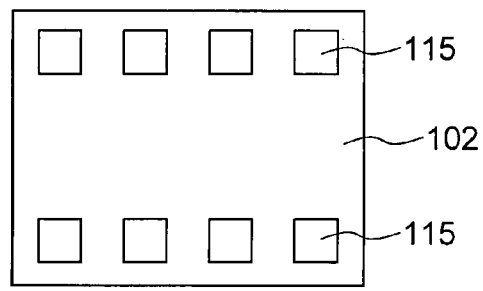
FIG. 6C is an enlarged plan view as seen from below of an IC chip used therein.
Figure 6D:
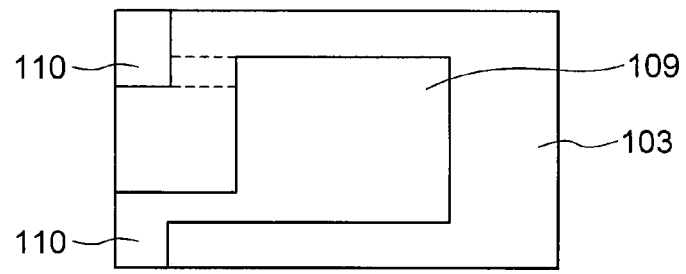
FIG. 6D is a plan view of a crystal piece used therein.

In the temperature-compensated oscillator of the present invention, a circuit function surface of an IC chip 2 in which are integrated an oscillating circuit 6 and a temperature-compensating device 7 (shown in FIG. 2) is affixed to an inner base surface 1d of a main container 1 formed from stacked ceramic layers 1a, 1b, and 1c, by ultrasonic thermal crimping or reflow using bumps 8, as shown in FIG. 1A. IC terminals 15 (15a and 15b) are disposed at diagonally opposite corner portions of one main surface of the IC chip 2, which is the circuit function surface thereof, as shown in FIG. 1B. Both sides of one edge portion of a crystal piece 3 (see FIG. 3B) extending from output electrodes (reference number 110 in FIG. 6B) are affixed by electrically conductive adhesive 11 to an inner wall step portion 1e of the main container 1. A metal cover 4 is then connected to an aperture edge surface of the main container 1 with a metal ring 12 therebetween, to hermetically seal the IC chip 2 and other components into the main container 1.

In this first embodiment, an active element 16a which is part of the oscillation circuit integrated into the IC chip 2, such as an oscillation amplifier or buffer amplifier, and which forms a heat source, is incorporated and disposed at a diagonally opposite corner region, as shown in FIG. 1B, and the IC terminals 15a are disposed at that diagonally opposite corner region. In addition, a temperature sensor 16b of the temperature-compensating device is incorporated and disposed at that other diagonally opposite corner region at the greatest distance from that first diagonally opposite corner portion of the IC chip 2, close to the IC terminals 15b at that other diagonally opposite corner region. The IC terminals 15a and 15b at the two diagonally opposite corner portions act as power source, ground, and output terminals to provide electrical connections to the mounting terminals 5.

As shown in FIG. 1B, IC terminals 15c for thermal dissipation are provided in a central region of one main surface of the IC chip 2. In this case, three of the IC terminals 15c for thermal dissipation are provided within the array of the IC terminals 15a and 15b that are disposed along the two side edges of the IC chip 2, by way of example. The IC terminals 15c for thermal dissipation are affixed to the circuit terminals provided on the inner base surface 1d of the main container 1 by ultrasonic thermal crimping or reflow using the bumps 8. The IC terminals 15c for thermal dissipation are connected to the ground terminal among the mounting terminals 5.

With this configuration, the active element 16a, which acts as a heat source, and the temperature sensor 16b are disposed adjacent to the IC terminals 15a and 15b, respectively. Thus the temperatures at the diagonally opposite corner regions at which the active element 16a and the temperature sensor 16b are disposed fall by thermal dissipation through the IC terminals 15a and 15b, the bumps 8, and the circuit terminals.

In addition, the diagonally opposite corner portions at which the active element 16a, which acts as a heat source, and the temperature sensor 16b are disposed at the greatest separation, as shown in FIG. 1B. Thus the temperature detected by the temperature sensor 16b can be hardly affected by the temperature generated by the active element 16a. Furthermore, since the IC terminals 15c provided for thermal dissipation in the central region of the IC chip 2 dissipate heat, the temperatures of the IC terminals 15a and 15b provided on both edges of the IC chip 2 as well as the IC chip 2 itself can be reduced overall.

This configuration ensures that the temperature sensor 16b can detect a temperature that is close to the ambient temperature which is the operating temperature of the crystal oscillator (the crystal piece 3) at startup of the temperature-compensated oscillator of the present invention, even if there is a temperature rise due to a heat source, particularly due to the active element 16a, and can supply a compensation voltage Vc corresponding to that operating temperature to the variable-voltage capacitor element 13 of the oscillating circuit 6. The frequency stability can therefore be increased at the startup of the temperature-compensated oscillator. The present invention is particularly useful for a temperature-compensated oscillator that operates intermittently in response to clock pulses, such as in a mobile phone.

SECOND EMBODIMENT

Figure 3A:
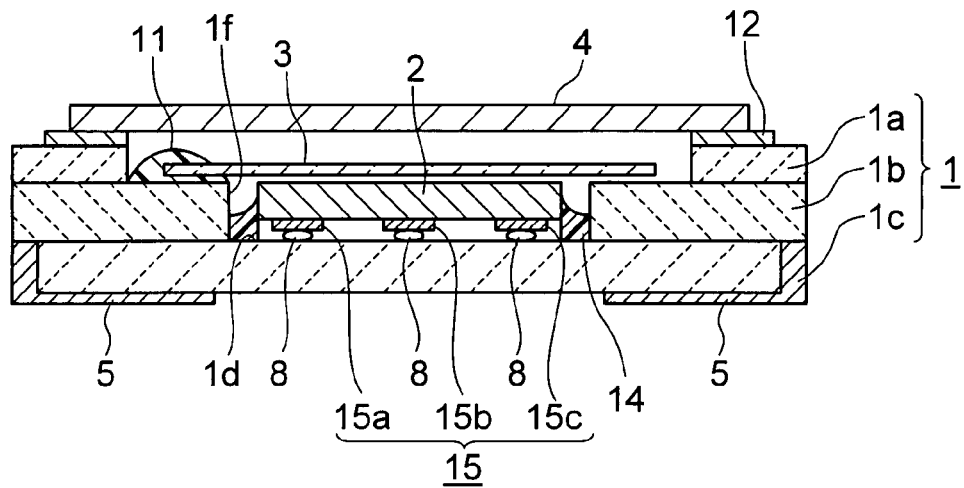
FIG. 3A is a sectional view thereof and FIG. 3B is a plan view from above with the cover and metal ring removed.
Figure 3B:
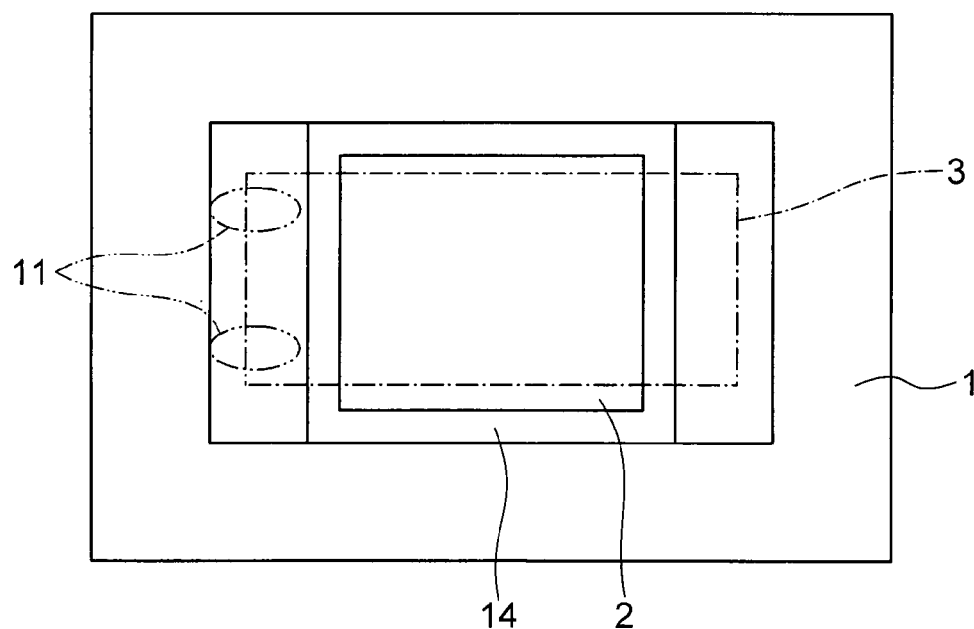

FIG. 3 shows a second embodiment of the temperature-compensated oscillator of the present invention, where FIG. 3A is a sectional view thereof and FIG. 3B is a plan view from above with the metal cover and crystal piece removed.

In addition to the configuration of the first embodying example described above, a thermally conductive adhesive 14 is applied to the outer periphery of the side surfaces (outer edges) of the IC chip 2, as shown in FIGS. 3A and 3B. This ensures that the outer periphery of the side surfaces (outer edges) of the IC chip 2 are affixed to the inner base surface 1d of the main container 1. In this case, the thermally conductive adhesive 14 is packed into the space between the outer periphery of the IC chip 2 and the inner walls of the main container 1. The thermally conductive adhesive 14 is formed of a thermally conductive material mixed into a base adhesive substance, where the thermally conductive material is formed of an insulating substance such as a ceramic and the base adhesive substance is of an epoxy type.

This configuration ensures that, even if the IC chip 2 generates heat due to circuit currents at the startup of the temperature-compensated oscillator of the present invention, that heat is dissipated through the thermally conductive adhesive 14 to the main container 1 formed of the stacked ceramic layers 1a, 1b, and 1c. In this case, the volume of the main container 1 is exceptionally high in comparison with the IC chip 2 and also the thermal capacity thereof is also high, so the thermal rise of the IC chip 2 can be suppressed to the utmost. Since the thermally conductive adhesive 14 adheres not only to the inner base surface 1d of the main container 1 but also to the inner wall step portion 1f thereof, the thermal dissipation effect can be further increased. Thus the temperature detected by the temperature sensor of the temperature-compensating device 7 that is integrated into the IC chip 2 can be made to be even closer to the operating temperature of the crystal oscillator at the startup of the temperature-compensated oscillator, in comparison with the previously described first embodiment. This ensures that the actual operating temperature of the crystal oscillator is detected and normal temperature compensation can be provided, even at the startup of the temperature-compensated oscillator, which enables an increase in frequency stability.

In addition, since the thermally conductive adhesive 14 is applied around the entire outer periphery of the side surfaces of the IC chip 2, as shown in FIGS. 3A and 3B, the strength of the attachment to the inner base surface 1d of the main container 1 is greater than that of just the bumps 8 by ultrasonic thermal crimping. Furthermore, since the base adhesive substance is an epoxy type, the strength of the attachment is greater than if it were a silicon type, and also since a ceramic is used as the thermally conductive material, the thermally conductive capabilities thereof are further increased while ensuring sufficient insulating capabilities.

Figure 4:
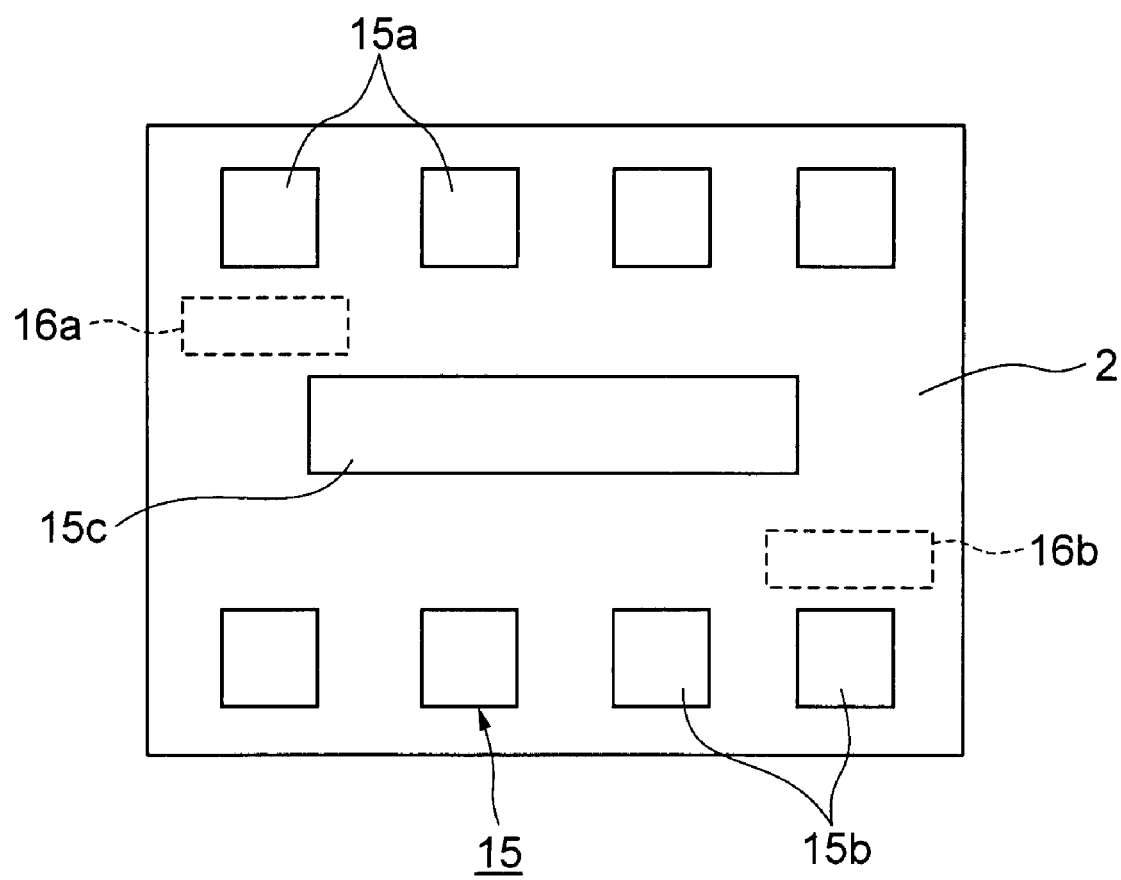
FIG. 4 is a plan view of an IC chip that is connected to IC terminals used in the temperature-compensated oscillator of the present invention.

In the above-described second embodying example, each IC terminal 15c for thermal dissipation and the circuit terminal connected thereto are formed individually, but the configuration could be such that a single IC terminal 15c is formed continuously in a plane shape having a large area, as shown in FIG. 4, and a circuit terminal connected thereto is formed in a similar continuous plane shape. In this case, the thermal dissipation effect can be further increased by an amount equivalent to the increase in area.

In this case, the thermally conductive adhesive 14 is applied continuously between the outer edges that form the circumference of the outer periphery of the side surfaces (outer edges) of the IC chip 2 and the inner wall surfaces of the main container 1, but it can also be applied discontinuously if necessary, such as only on the outer periphery of the side surfaces where the temperature sensor is positioned, so it basically need only be applied at locations that are necessary from the viewpoint of obtaining a normal startup characteristic.

THIRD EMBODIMENT

Figure 5A:
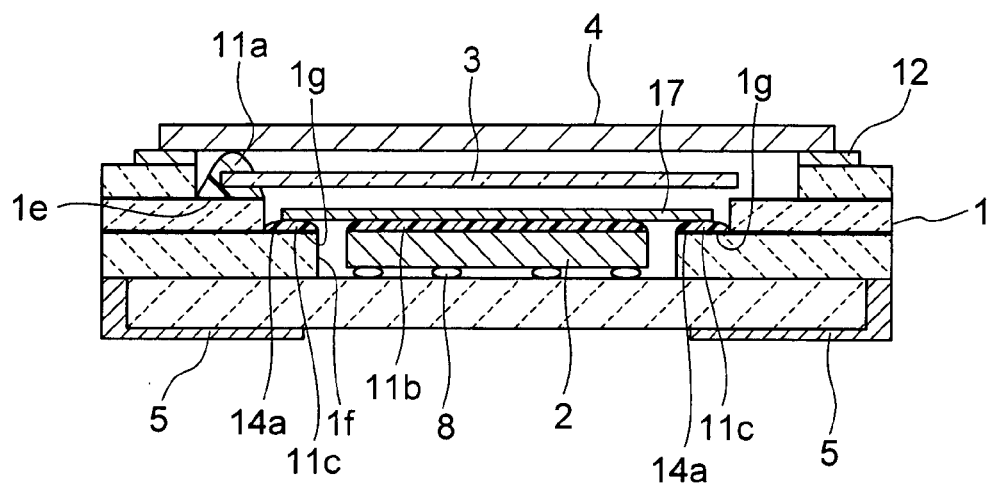
FIG. 5A is a sectional view thereof and FIG. 5B is a plan view from above with the cover and metal ring removed.
Figure 5B:
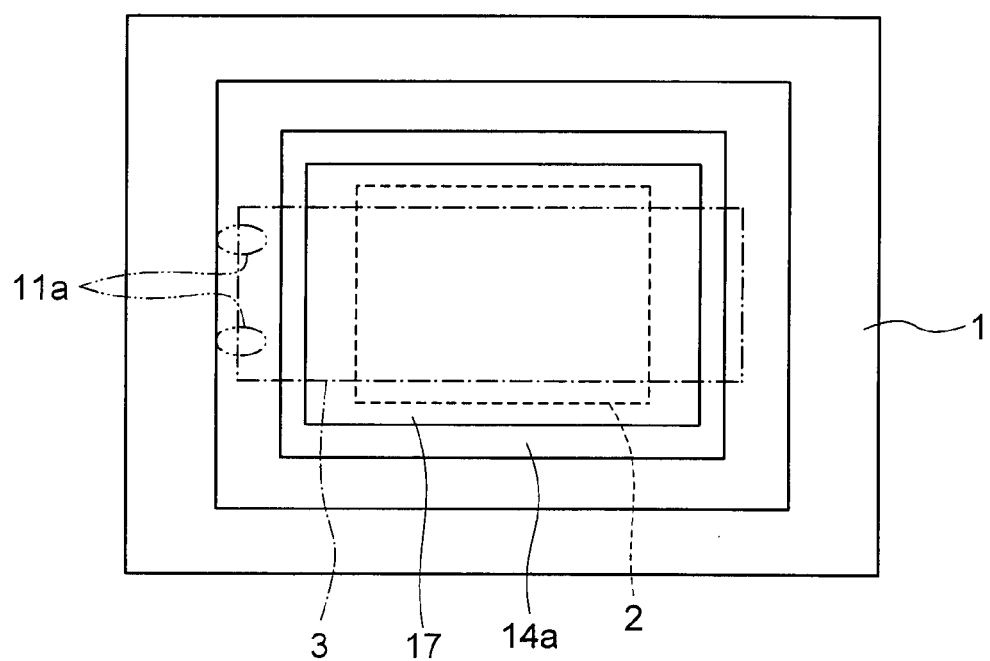

FIG. 5 shows a third embodiment of the present invention, where FIG. 5A is a sectional view thereof and FIG. 5B is a plan view from above with the metal cover and crystal piece removed.

In this third embodiment, upper and lower stages 1e and 1g are formed circumferentially in the inner wall step portion of the main container 1, as shown in FIG. 5A. In addition, both sides of one end portion of the crystal piece 3 are affixed to the upper stage 1e. A metal film 14a is formed on the lower stage 1g of a metal with a high thermal conductivity, such as Au or Cu. The metal film 14a is connected electrically to a ground terminal among the mounting terminals 5, by means such as a via hole (not shown in the figure). The outer periphery of a metal plate 15 is affixed to the lower stage 1g and a central region thereof is affixed to cover the remaining main surface of the IC chip 2, by the electrically conductive adhesive 11 that is a thermally conductive material.

This configuration ensures that the lower stage 1g of the main container 1 and the other main surface of the IC chip 2 are linked thermally through the metal plate 15 that is affixed thereto by the electrically conductive adhesive (thermally conductive material) 11c. The heat of the IC chip 2 that is generated by circuit currents, particularly at the startup of the temperature-compensated oscillator, can therefore be transferred to the main container 1 and then dissipated to the exterior.

In this third embodiment, the entire outer periphery of the metal plate 17 is affixed circumferentially to the lower stage 1g and the central region thereof is affixed to the entire surface of the other main surface of the IC chip 2, by the thermally conductive adhesive 11b. The metal film 14a with a high thermal conductivity is also formed circumferentially on the outer periphery of the lower stage 1g, of the metal film 14a that is connected to the ground terminal. This increases the thermal dissipation effect, so that the temperature detected by the temperature sensor and the operating temperature of the crystal oscillator are closer at startup, the temperature-compensation operation is normal, and the frequency stability is increased.

In addition, since the metal plate 15 connected to the ground terminal shields the IC chip 2 and the crystal piece 3, electrical interference between the IC chip 2 and the crystal piece 3 is prevented and thus the noise components of the oscillation frequency can be reduced.

In the above-described third embodiment, the lower stage 1g of the main container 1 is provided circumferentially, but it could equally well be provided partially on at least two edge sides of the main container 1, with the metal plate 15 that crosses the IC chip 2 affixed to those two edges. In addition, the lower stage 1g could be provided on only one edge side of the main container 1 and the other main surface of the IC chip 2 and the lower stage 1g could be linked thermally by the metal plate 15. The adhesive is not limited to the electrically conductive adhesive 11 as the thermally conductive material; it could equally well be an insulating adhesive with thermal conduction capabilities.

The thermally conductive material mixed into the base adhesive substance could also be thermally conductive particles made of a ceramic. These thermally conductive particles are made to have a particle diameter of at least 20 μm but no more than 200 μm, which is big enough to prevent them entering the space between the circuit function surface (the first main surface) of the IC chip 2 and the inner base surface of the main container 1, in other words, less than the height 15 to 20 μm of the bumps. This can prevent the thermally conductive particles from penetrating into the space between the circuit function surface and the inner base surface, even if the base adhesive substance penetrates therein.

What is claimed is:

1. A temperature-compensated crystal oscillator for surface mounting wherein an IC chip into which is integrated a temperature-compensated device having an oscillating circuit and a temperature sensor, which supplies a compensation voltage to a variable-voltage capacitor element of the oscillating circuit, and which also has IC terminals disposed along two edges comprising at least diagonally opposite corner portions of one main surface that acts as a circuit function surface is affixed with the use of bumps to an inner base surface of a main container that is concave in section, and two sides of one edge portion of a crystal piece are affixed to an inner wall step portion of the main container; wherein an active element of the oscillating circuit that acts as a heat source and a temperature sensor of the temperature-compensated device are disposed at diagonally opposite corner regions of the IC chip at the greatest distance apart.

2. The temperature-compensated crystal oscillator for surface mounting according to claim 1, wherein the IC terminals disposed at diagonally opposite corner portions of the IC chip are connected electrically to mounting terminals provided on an outer base surface of the main container.

3. A temperature-compensated crystal oscillator for surface mounting wherein an IC chip into which is integrated a temperature-compensated device having an oscillating circuit and a temperature sensor, which supplies a compensation voltage to a variable-voltage capacitor element of the oscillating circuit, and which also has IC terminals disposed along two edges comprising at least diagonally opposite corner portions of one main surface that acts as a circuit function surface is affixed with the use of bumps to an inner base surface of a main container that is concave in section, and two sides of one edge portion of a crystal piece are affixed to an inner wall step portion of the main container; wherein an IC terminal for thermal dissipation is provided in a central region of the IC chip.

4. The temperature-compensated crystal oscillator for surface mounting according to claim 3, wherein an active element of the oscillating circuit that acts as a heat source and a temperature sensor of the temperature-compensated device are disposed at diagonally opposite corner regions of the IC chip at a distance apart.

5. The temperature-compensated crystal oscillator for surface mounting according to claim 1, wherein a thermally conductive adhesive formed of thermally conductive particles mixed into a base adhesive substance is applied to the outer side surface periphery of the IC chip.

6. The temperature-compensated crystal oscillator for surface mounting according to claim 2, wherein a thermally conductive adhesive formed of thermally conductive particles mixed into a base adhesive substance is applied to the outer side surface periphery of the IC chip.

7. The temperature-compensated crystal oscillator for surface mounting according to claim 3, wherein a thermally conductive adhesive formed of thermally conductive particles mixed into a base adhesive substance is applied to the outer side surface periphery of the IC chip.

8. The temperature-compensated crystal oscillator for surface mounting according to claim 4, wherein a thermally conductive adhesive formed of thermally conductive particles mixed into a base adhesive substance is applied to the outer side surface periphery of the IC chip.

9. A temperature-compensated crystal oscillator for surface mounting wherein an IC chip into which is integrated an oscillating circuit and a temperature-compensating device is affixed with the use of bumps to an inner base surface of a main container and also two sides of one edge portion of a crystal piece are affixed to an inner wall step portion of the main container; wherein a thermally conductive adhesive formed of thermally conductive particles mixed into a base adhesive substance is applied to the outer side surface periphery of the IC chip.

10. The temperature-compensated crystal oscillator for surface mounting according to claim 9, wherein the base adhesive substance is an epoxy type, and the thermally conductive particles are of an insulating substance.

11. The temperature-compensated crystal oscillator for surface mounting according to claim 9, wherein the thermally conductive particles have a particle diameter that is larger than the space between the IC chip and the inner base surface of the main container.

12. A temperature-compensated crystal oscillator for surface mounting wherein one main surface of an IC into which is integrated an oscillating circuit and a temperature-compensating device is affixed with the use of bumps to an inner base surface of a main container of a concave shape and having mounting terminals on an outer base surface thereof, and an outer peripheral portion of a crystal piece from which extends an output electrode is affixed to an inner wall step portion of the main container; wherein the inner wall step portion has a two-stage configuration with an upper stage and a lower stage; an outer peripheral portion of the crystal piece is affixed to the upper stage; a metal plate is affixed to the lower stage by a thermally conductive material; and the lower stage is linked thermally to the other main surface of the IC chip by a metal plate affixed thereto.

13. The temperature-compensated crystal oscillator for surface mounting according to claim 12, wherein the lower stage is provided on at least two edge sides of the main container and also the metal plate crosses the other main surface of the IC chip.

14. The temperature-compensated crystal oscillator for surface mounting according to claim 12, wherein the thermally conductive material is an electrically conductive adhesive, and also a metal film connected to a ground terminal that is one of the mounting terminals is provided on the surface of the lower stage to which the metal plate is affixed.

15. The temperature-compensated crystal oscillator for surface mounting according to claim 12, wherein the metal plate provides electrical shielding between excitation electrodes of the crystal piece and the IC chip.

* * * * *